(12) United States Patent
Fletcher et al.

(10) Patent No.: US 8,641,941 B2
(45) Date of Patent: Feb. 4, 2014

(54) PHOTOCATALYTIC REACTIONS IN NANO-IMPRINT LITHOGRAPHY PROCESSES

(75) Inventors: Edward Brian Fletcher, Austin, TX (US); Frank Y. Xu, Round Rock, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 13/446,364

(22) Filed: Apr. 13, 2012

(65) Prior Publication Data

US 2012/0201969 A1 Aug. 9, 2012

Related U.S. Application Data

(63) Continuation of application No. 12/612,129, filed on Nov. 4, 2009, now abandoned.

(60) Provisional application No. 61/111,026, filed on Nov. 4, 2008.

(51) Int. Cl.
*B29C 59/02* (2006.01)

(52) U.S. Cl.
USPC .............................. 264/39; 264/219; 264/338

(58) Field of Classification Search
USPC .............................. 264/39, 219, 338
See application file for complete search history.

(56) References Cited

U.S. PATENT DOCUMENTS 3,620,820 A * 11/1971 Hess ........................ 427/427.4
5,164,278 A * 11/1992 Brunsvold et al. ............ 430/176
2007/0145643 A1* 6/2007 Dijksman et al. ............. 264/319

* cited by examiner

*Primary Examiner* — James Sanders
(74) *Attorney, Agent, or Firm* — Cameron A. King (57) ABSTRACT

An imprint lithography template having a photoactive coating adhered to a surface of the template. Irradiation of the photoactive coating promotes cleaning of the template by decomposition of organic material proximate the template (e.g., organic material adsorbed on the template). An imprint lithography system may be configured such that template cleaning is achieved during formation of a patterned layer on an imprint lithography substrate. Cleaning of the template during an imprint lithography process reduces down-time that may be associated with template maintenance.

20 Claims, 6 Drawing Sheets

PHOTOCATALYTIC REACTIONS IN NANO-IMPRINT LITHOGRAPHY PROCESSES

CROSS-REFERENCE TO RELATED APPLICATIONS

This application is a continuation of U.S. Ser. No. 12/612,129 filed Nov. 4, 2009, which claims the benefit under 35 U.S.C. §119(e)(1) of U.S. Provisional Ser. No. 61/111,026 filed Nov. 4, 2008, each of which is incorporated by reference herein in its entirety.

TECHNICAL FIELD

The present invention relates to photocatalytic reactions in nano-imprint lithography processes.

BACKGROUND

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate; therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as US Patent Application Publication No. 2004/0065976, US Patent Application Publication No. 2004/0065252, and U.S. Pat. No. 6,936,194, all of which are hereby incorporated by reference herein.

An imprint lithography technique disclosed in each of the aforementioned U.S. patent application publications and patent includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and the formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

SUMMARY

In one aspect, an imprint lithography template has a photoactive coating adhered to a surface of the template. Irradiation of the photoactive coating promotes cleaning of the template by decomposition of organic material proximate the template (e.g., organic material adsorbed on the template). An imprint lithography system may be configured such that template cleaning is achieved during formation of a patterned layer on an imprint lithography substrate. Cleaning of the template during an imprint lithography process reduces down-time that may be associated with template maintenance.

DETAILED DESCRIPTION

Figure 1:
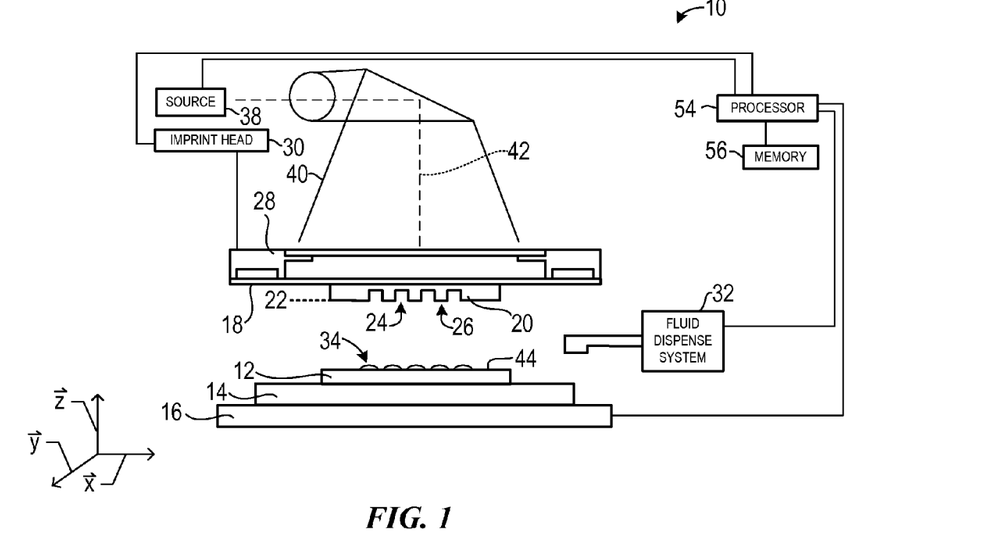
FIG. 1 illustrates a simplified side view of a lithographic system.

Referring to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide motion about the x-, y-, and z-axes. Stage 16, substrate 12, and substrate chuck 14 may also be positioned on a base (not shown).

Spaced-apart from substrate 12 is a template 18. Template 18 generally includes a mesa 20 extending therefrom towards substrate 12, mesa 20 having a patterning surface 22 thereon. Further, mesa 20 may be referred to as mold 20. Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electromagnetic, and/or other similar chuck types. Exemplary chucks are further described in U.S. Pat. No. 6,873,087, which is hereby incorporated by reference herein.

Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 20 and substrate 12 depending on design considerations. Polymerizable material 34 may comprise a monomer as described in U.S. Pat. No. 7,157,036 and US Patent Application Publication No. 2005/0187339, all of which are incorporated by reference herein.

Figure 2:
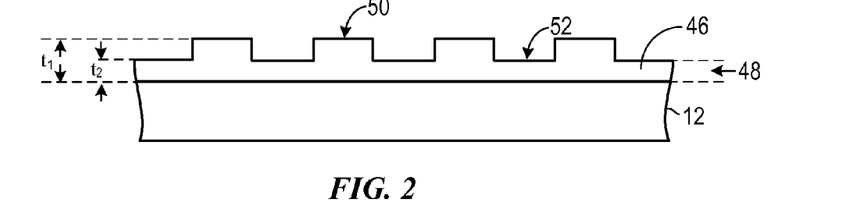
FIG. 2 illustrates a simplified side view of the substrate shown in FIG. 1 having a patterned layer positioned thereon.

Either imprint head 30, stage 16, or both vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., broadband ultraviolet radiation, causing polymerizable material 34 to solidify and/or cross-link conforming to shape of a surface 44 of substrate 12 and patterning surface 22, defining a patterned layer 46 on substrate 12. Patterned layer 46 may comprise a residual layer 48 and a plurality of features shown as protrusions 50 and recessions 52, with protrusions 50 having a thickness $t_1$ and residual layer 48 having a thickness $t_2$.

The above-described system and process may be further implemented in imprint lithography processes and systems referred to in U.S. Pat. No. 6,932,934, US Patent Application Publication No. 2004/0124566, US Patent Application Publication No. 2004/0188381, and US Patent Application Publication No. 2004/0211754, each of which is hereby incorporated by reference herein.

Radiation Triggered Release and Anti-Wetting Technology for Imprinting

Figure 3:
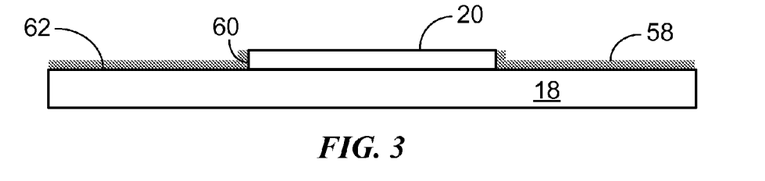
FIG. 3 illustrates a release layer on the etched-back surface and mesa wall of a nano-imprint lithography template.

In some embodiments, as shown in FIG. 3, a release or anti-wetting layer 58 may be formed on the etched-back surface 62, including mesa walls 60, of a template 18 to reduce the extrusion of the polymerizable material and contamination of the mesa walls and etched-back surface of the template with polymerizable material during an imprinting process. Formation of the release or anti-wetting layer is enhanced by the presence of a photoinitiator that generates an effective catalyst for condensation reactions between the template and silane components in the release or anti-wetting layer, thereby speeding up the formation of the release or anti-wetting layer. In some embodiments, the catalyst is a superacid.

Variations in environmental conditions (e.g., humidity content) may impact the process consistency of making an anti-wetting or release layer. In some cases, the catalyst may reduce dependence of the bonding strength between the release or anti-wetting layer and the template on the extent of environmental humidity during formation of the layer. For example, the catalyst may reduce the dependence of silane hydrolysis on environmental humidity, such that release or anti-wetting layers formed under different environmental conditions have substantially the same thickness and bonding strength.

Compositions used to form a release/anti-wetting layer on a template may include mono-functional silanes, di-functional silanes, or a combination thereof. An example of a composition used to form a release/anti-wetting layer on a template includes 0.98 g1,1,2,2,H,H,H,H-perfluorooctyl-trichlorosilane or (tridecafluoro-1,1,2,2-tetrahydrooctyl) trichloro-silane (FOTS), available as SIT8174.0 from Gelest, Inc. (Tullytown, Pa.); 0.02 g UVI-6976, a cationic photoinitiator available from Dow Chemical Company (Midland, Mich.); and a variable amount of HFE7100 DL, a fluorinated solvent available from 3M (St. Paul, Minn.). UVI-6976 includes triarylsulfonium hexafluoroantimonate salts. HFE7100 DL may be added in any amount to make a composition with a total content of the silane and photoinitiator from about 0.001 wt % to about 5 wt %, or from about 0.01 wt % to about 1 wt %. In an example, a total content of the silane and photoinitiator is about 300 ppm.

Figure 4:
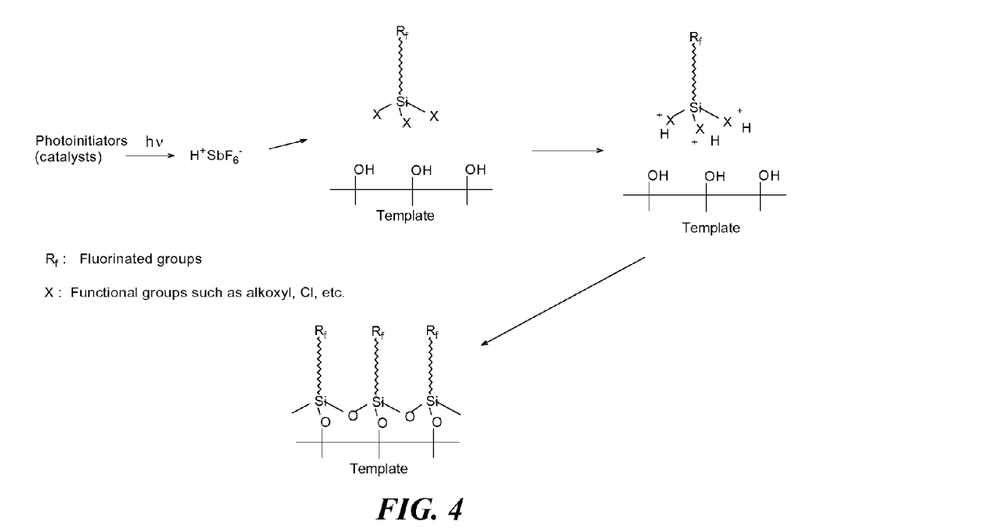
FIG. 4 illustrates formation of a mono-silane based anti-wetting/release layer.
Figure 5:
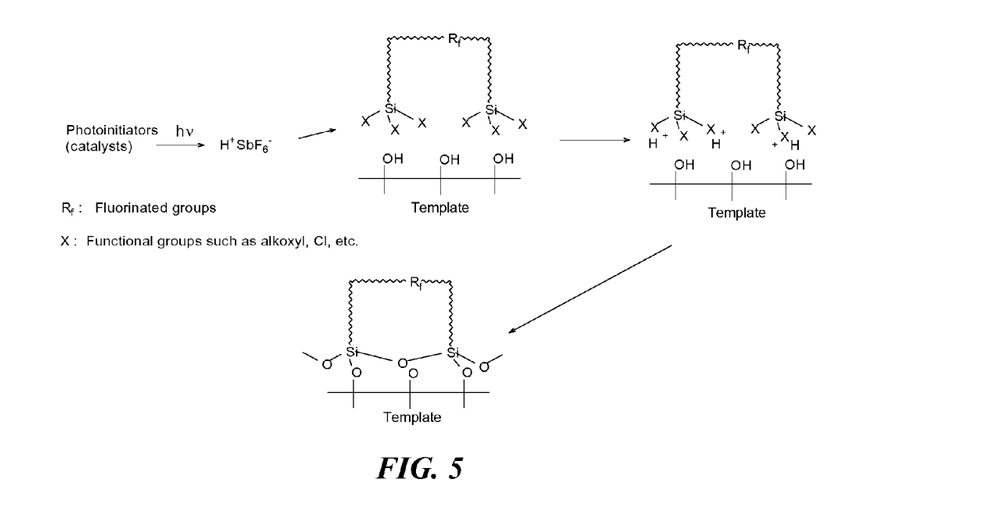
FIG. 5 illustrates formation of a di-silane based anti-wetting/release layer.

A composition for forming a release/anti-wetting layer on a template may be applied to a template by methods including, for example, spin-coating or casting. After the solvent evaporates, the surface is exposed to radiation (e.g., UV radiation), and the release/anti-wetting film forms quickly. FIGS. 4 and 5 illustrate reaction of mono-silane- and di-silane-based anti-wetting/release layer compositions, respectively, with imprint lithography templates.

Imprint Lithography Template with Self-cleaning Capability

UV-curable materials used for drop dispense applications may include low viscosity acrylate monomers and cross-linking agents. The low viscosity components begin to evaporate immediately after dispense. The evaporation rate may be accelerated by air flow, purging (e.g., with helium), heat, reduced pressure (e.g., in a vacuum environment), or a combination thereof around the drops during an imprint lithography process.

Figure 6:
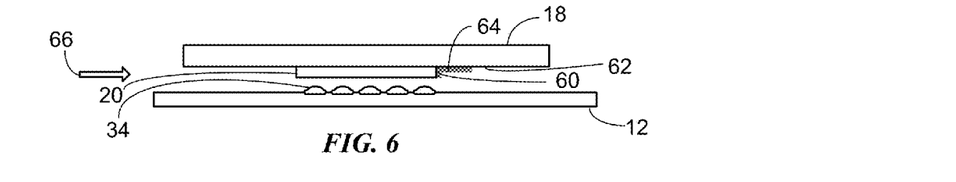
FIG. 6 illustrates deposition of organic build-up on the etched-back surface of a template.

In some cases, polymerizable material 34 that evaporates during an imprint lithography process may redeposit on the etched-back surface 62, including mesa walls 60, of template 18. The accumulation of condensed vapor 64 may be greatest in the path of net air or helium flow 66, as illustrated in FIG. 6. However, the vapor may deposit over any area of the template.

The formation and accumulation of organic material on the etched-back surface, including the mesa walls, may be disadvantageous in imprint lithography processes. For example, the condensed vapor may accumulate to a thickness on a mesa wall such that it disturbs normal imprinting mechanics, resulting in features not filling due, for example, to template deflection or non-conformance to the substrate. In some cases, the condensed vapor may deposit on a mesa wall and form a lip at the edge which props the template up, thereby causing a distortion in the template which causes some drops of the polymerizable material on the substrate to remain untouched by the template. The drops not contacted by the template do not spread and fill the template in that area, leaving features unfilled. The condensed vapor may also cause feature bridging and collapse when the material evaporates from the etched-back surface and re-deposits on an imprinted die. The degree of contamination of the etched-back surface may be affected by the evaporation rate of the polymerizable composition, helium flow characteristics, channel geometry that the vapor must travel to escape, surface chemistry of the template, vapor exposure time interval, and other factors.

Figures 7, 8A, 8B, 8C, 8D:
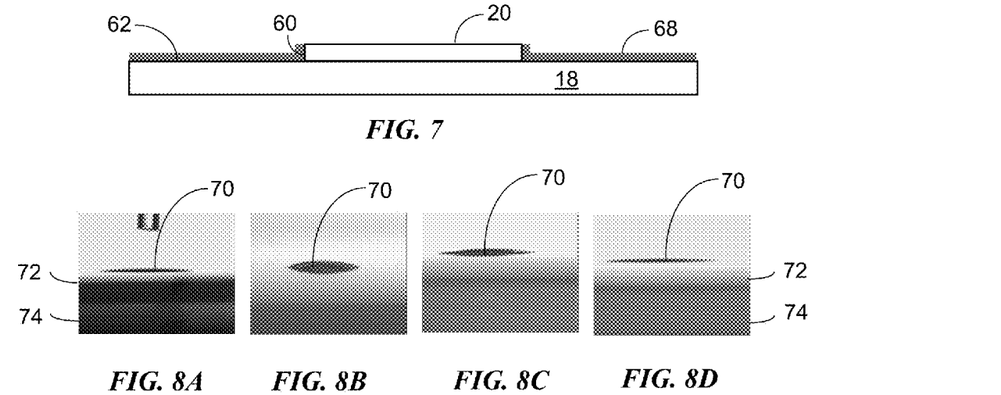
FIG. 7 illustrates a template with a photoactive coating on the mesa wall and the etched-back surface.
FIGS. 8A-8H show wetting of clean and contaminated titania and silicon surfaces.

A self-cleaning template may be used to remove adsorbed organic contamination on the etched-back surface. For example, a template 18 may be coated with a thin layer of photocatalytic material 68 on the etched-back surface 62 and mesa wall 60, as depicted in FIG. 7. The layer of photocatalytic material may have a thickness of, for example, at least about 5 nm, at least about 15 nm, or at least about 30 nm. The coating 68 may be applied after the mesa etch step while the active area is still masked. The photocatalytic material may include, for example, titanium oxide ($TiO_2$), zinc oxide (ZnO), tin oxide ($SnO_2$), iron oxide ($Fe_2O_3$), or a combination thereof.

A photoactive coating may provide a passive and unobtrusive technique to inhibit or delay effects associated with off-mesa vapor accumulation. As each imprint is exposed to UV light for curing, the photoactive surface may be cleaned by photodecomposition of organic material on the surface. At other times, such as during wafer changes or idle time, UV light may also be passed through the template for cleaning. A clean surface may be regenerated repeatedly by irradiating the off-mesa area.

In some embodiments, a photoactive coating may be activated by exposure to visible radiation, infrared radiation, or radiation of another wavelength. For example, a template may be exposed to visible light for cleaning without interrupting the imprint process if the polymerizable material is not sensitive to visible radiation. An optical filter, such as a bandpass filter, may be used to limit wavelengths that are passed through the template to activate the cleaning process. Since the presence of oxygen and humidity facilitate the cleaning process, a helium purge may be discontinued during cleaning to allow a source of oxygen and humidity (e.g., air) to be available. Ozone may also be introduced during the cleaning process.

Crystalline titania, notably the anatase structure, is photocatalytic when exposed to light with a wavelength less than about 360 nm. With a band gap energy of 3.2 eV, UV light is absorbed and produces electrons and holes that react with oxygen and water vapor in the air. From this reaction, highly reactive OH. radicals and $O_2^-$ anions are formed. These species are capable of decomposing adsorbed organic compounds into carbon dioxide and water. The concentration of reactive species formed at the surface may depend on factors including, for example, availability of oxygen and water vapor, titania film thickness and light absorption, radiation spectrum and intensity, and exposure time.

Photoactive coatings may be applied to an imprint lithography template by methods including, for example, plasma vapor deposition, chemical vapor deposition, and sol-gel methods.

Substitutional doping of metals for titanium (e.g., cobalt, iron, chromium, and the like) and non-metals for oxygen (e.g., nitrogen, fluorine, carbon, phosphorus, sulfur, and the like) in titania may increase the sensitivity of a photoactive coating to UV irradiation or extend the photocatalytic activity into the visible spectrum. The band gap of titania is too large for absorption in the visible spectrum, however, doping titania films with carbon or nitrogen, for instance, reduces the band gap energy so that the film can absorb light in the visible region. The sensitivity of a photoactive coating may also be increased by using a high surface area film. For example, the titania film may be made with a mesoporous structure to increase the surface area, or the titania may be coated over a high surface area material such as anodized aluminum.

In an example, titanium oxide ($Ti_3O_5$), available from CERAC, Inc., Milwaukee, Wis.) was evaporated on a 6" fused silica wafer and a silicon wafer. A thickness of the titania coating on the silicon wafer was measured at 39 nm by ellipsometry (model M-2000 DI available from J.A. Woollam Co., Lincoln, Nebr.). The titania coated fused silica wafer was sectioned into pieces, and the pieces were annealed in air at 350° C. for 4 hours.

Experiments were carried out to assess the photocatalytic activity of the titania surface using a broadband medium pressure Hg lamp (available from Optical Associates, Inc., San Jose, Calif.) with an intensity of 16 mW/cm$^2$ at a wavelength of 365 nm as measured at the substrate position. The experiments were performed at 29-56% relative humidity and temperatures of 61-63° F. Organic contamination was deposited by vapor (non-polymerizable organic compound) or liquid solution (acrylate composition with photoinitiator).

FIGS. 8A-8D are photographs of water wetting a titania surface on a fused silica substrate under various conditions. As seen in FIG. 8A, water 70 wets a clean titania surface 72 formed on a fused silica substrate 74 (contact angle <5°). Isobornyl acrylate (IBOA, available from Sartomer Company, Inc., Exton, Pa.) was pipetted on the titania surface 72 and allowed to spread. The IBOA was evaporated from the surface by blowing with compressed nitrogen. A contaminant layer remained on the titania surface 72. FIG. 8B shows decreased wetting by water 70 on the IBOA-contaminated surface. The IBOA-contaminated surface was then exposed to UV light for 60 sec, and a drop of water 70 was placed on the surface. As seen in FIG. 8C, the wettability of the titania surface in FIG. 8A was not fully restored. However, when the IBOA-contaminated surface was then exposed to UV light for 300 sec, and a drop of water 70 was placed on the surface, wettability of the titania surface was restored (contact angle <5°). Thus, UV irradiation of the titania surface cleaned the IBOA contaminant from the surface.

Figure 8E:
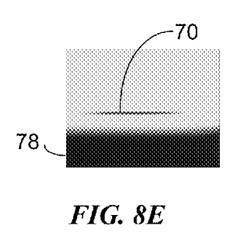
Figure 8F:
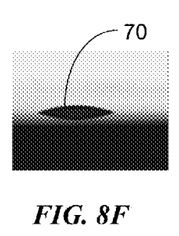
Figure 8G:
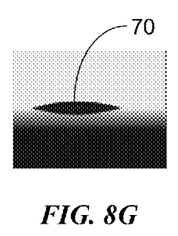
Figure 8H:
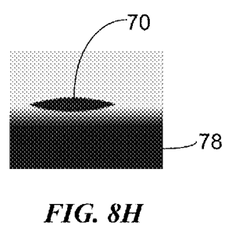

In contrast, as seen in FIGS. 8E-8H, wettability of a clean silicon wafer with a native oxide surface cannot be fully restored by UV irradiation. FIG. 8E shows wetting of clean silicon wafer 78 with native oxide surface by water 70 (contact angle <5°). IBOA was pipetted on the silicon wafer surface and allowed to spread. A contaminant layer remained on the silicon surface. FIG. 8F shows decreased wetting by water 70 on the IBOA-contaminated surface. The IBOA-contaminated surface was then exposed to UV light for 180 sec, and a drop of water 70 was placed on the surface. As seen in FIG. 8G, the wettability of the silicon surface in FIG. 8F was substantially unchanged. The IBOA-contaminated surface was then exposed to UV light for 780 sec, and a drop of water 70 was placed on the surface. As seen in FIG. 8H, the wettability of the silicon surface in FIG. 8F was still substantially unchanged. Thus, UV irradiation of the silicon surface did not clean the IBOA contaminant from the surface.

Figure 9A:
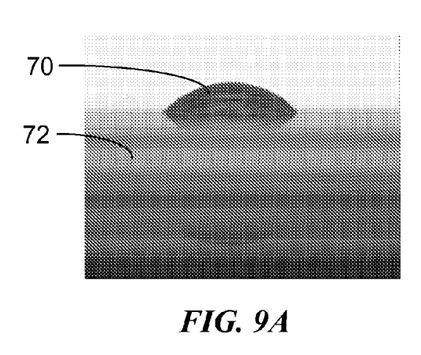
FIGS. 9A-9B show wetting of a clean titania surface and a contaminated titania surface.
Figure 9B:
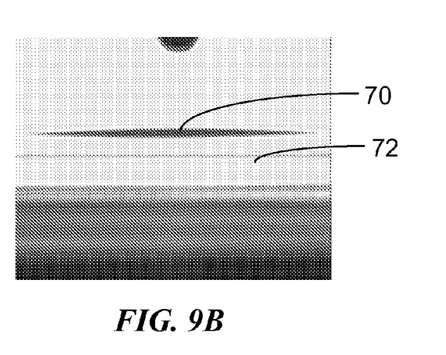

In another example, removal of light (e.g., non-polymerizable) organics deposited on the surface from air was studied. A pre-cleaned titania sample was placed in a location to allow exposure to light organics for two days. As seen in FIG. 9A, a water contact angle of 48° was measured. After exposing the sample to UV light for 30 sec, a water contact angle of less than 5° was measured, as seen in FIG. 9B.

In the process of imprinting a die near a previously formed and cured imprint, the previously cured imprint may be located beneath the etch-back region of the template. It is believed that reactive radicals generated at the surface of the photocatalytic material travel a distance of several microns in air, however the distance between the substrate (e.g., the wafer) and the etched-back region, which is defined by the mesa height, may be large enough to inhibit decomposition of the imprints that are beneath the etched-back area. In addition to the separation distance, the imprint is cross-linked and less likely to decompose in comparison to light organics and liquid or gel material on the template surface.

Figure 10:
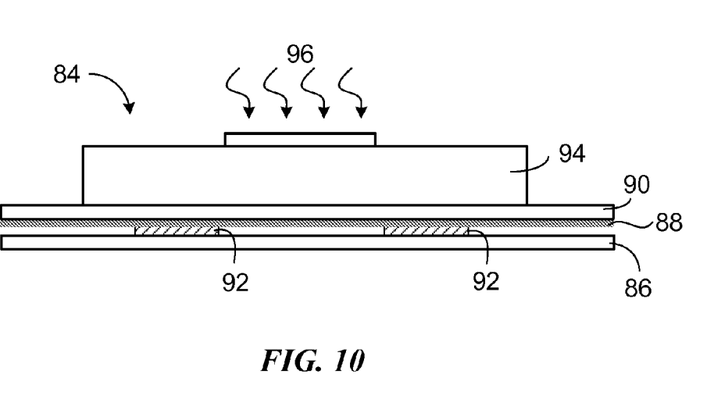
FIG. 10 illustrates a test apparatus for photocatalytic reactions in nano-imprint lithography processes.

FIG. 10 illustrates an apparatus 84 for testing decomposition of an imprint in the presence of radicals generated at a photocatalytic surface. Apparatus 84 includes silicon wafer 86 treated with a polymerizable composition including isobornyl acrylate (Sartomer Company), aliphatic urethane acrylate (Genomer 1122, Rahn USA Corp., Aurora, Ill.), 1,6-hexanediol diacrylate (HDODA, UCB Chemicals, Smyna, Ga.), and 2-hydroxy-2-methyl-1-phenyl-propan-1-one (DAROCUR® 1173, Ciba Specialty Chemicals, Tarrytown, N.Y.) dissolved in propylene glycol monomethyl ether acetate (PGMEA) solvent. The polymerizable material is described in U.S. Patent Application Publication No. 2008/0110557, which is incorporated by reference herein. The opposing titania surface 88, formed on fused silica wafer 90, was also treated with polymerizable material. Size #0 cover glasses were used as shims 92 to define the gap between the titania and silicon samples. The shim thickness was approximately 100 microns. A 65×65×8 mm fused silica template 94 was placed on top of the stack to weigh it down. The stack was exposed to UV light 96 for 90 sec. Images of water wetting the titania surface 88 and the silicon surface 86 were taken.

Figure 11A:
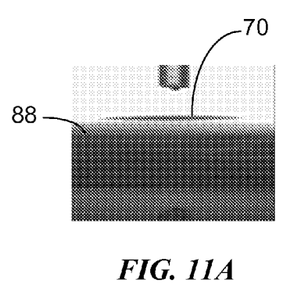
FIGS. 11A-11F show wetting of clean and contaminated titania and silicon.
Figure 11B:
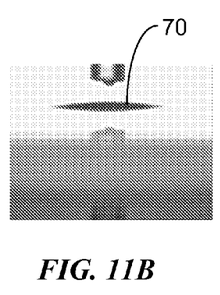
Figure 11C:
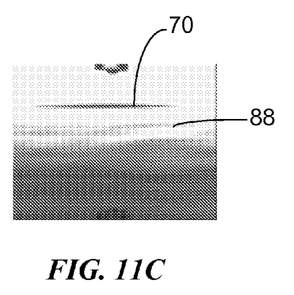

FIG. 11A shows water drop 70 on the clean titania surface 88. FIG. 11B shows water drop 70 on the titania surface 88 coated with polymerizable material. FIG. 11C shows water drop 70 on titania surface 88 after 90 sec UV exposure. The titania surface became highly wettable again after being exposed to the UV light.

Figure 11D:
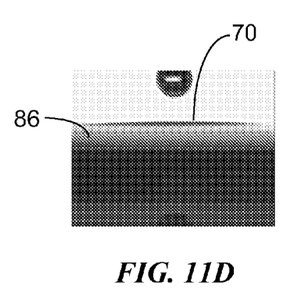
Figure 11E:
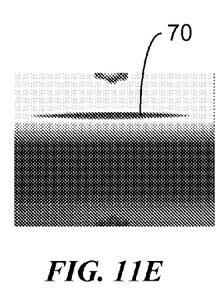
Figure 11F:
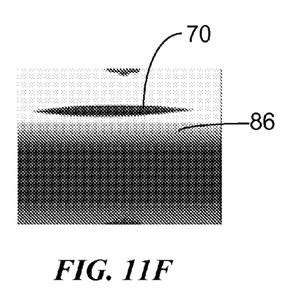

FIG. 11D shows water drop 70 on clean silicon surface 86. FIG. 11E shows water drop 70 on the silicon surface coated with polymerizable material. FIG. 11F shows water drop 70 on silicon surface 86 after 90 sec UV exposure. That the contact angle of the water on the silicon surface did not decrease may indicate that decomposition associated with the photoactive titania surface did not substantially extend to the silicon surface 100 microns away in the set-up shown in FIG. 10.

Photoactive Template Cleaning Device

Figure 12:
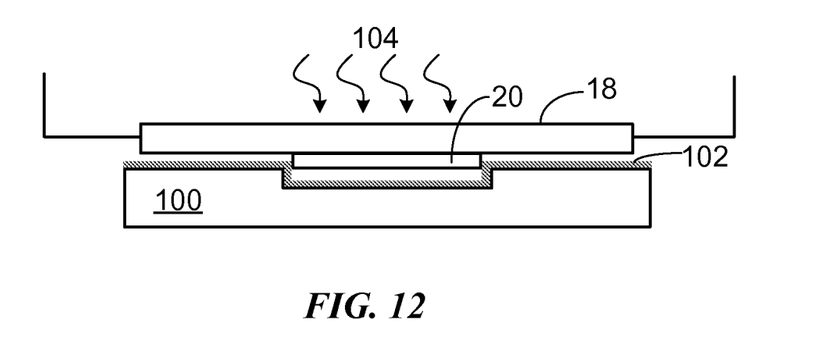
FIG. 12 illustrates a device for cleaning etched-back and mesa areas of a nano-imprint lithography template.

In some embodiments, a device with a photoactive material, such as titania, may be used to clean an imprint lithography template. FIG. 12 illustrates cleaning device 100 with photocatalytic coating 102 positioned proximate template 18. In an example, cleaning device 100 is positioned within a few microns of template 18. Air, oxygen, ozone, or the like may be introduced between the template 18 and the cleaning device 100 to facilitate the decomposition of organic material on the template. The cleaning device 100 may contain gas delivery ports to inject gas directly into the gap that separates the cleaning device from the template.

In some cases, alignment indicia on the template 18 and device 100 may be used to accurately position the device (e.g., in the x-y plane) relative to the template. The z position, or gap distance, may be determined from another method, such as by interferometry. Upon irradiation of the device 100 with energy 104, reactive radical species generated by the photoactive material facilitate the decomposition of adsorbed contaminants on the template surface. The rate of this decomposition will increase with a decrease in distance between the device 100 and template 18. Device 100 may be, for example, installed on an imprint tool and the template 18 may be cleaned while loaded on the tool. Energy for the photocatalytic reaction may come from the UV source used to cure the imprint resist, or a separate source of radiation (e.g., visible or UV radiation).

Figure 13:
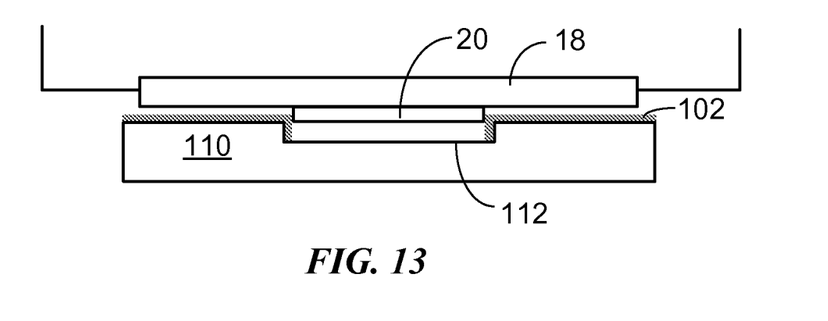
FIG. 13 illustrates a device for cleaning etched-back surfaces of a nano-imprint lithography template.

Device 100 may be used for cleaning the etched-back surface 62 and mesa or mold 20 of template 18. For cleaning the etched-back surface only, a device may be fabricated so that substantially no photoactive coating is present below the mesa. FIG. 13 illustrates device 110 substantially free from photoactive coating in region 112 designed to be positioned proximate mesa 20.

In some embodiments, the cleaning device may have a flat surface, with a photoactive coating on the surface on the order of the dimensions of the template to be cleaned. The device may be positioned proximate a template during a cleaning process without regard to aligning the mold with a recessed cleaning surface.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:

1. A method of forming an anti-wetting layer on an imprint lithography template comprising:
    providing an imprint template having an etched-back surface having hydroxyl groups;
    applying an anti-wetting film to the etched-back surface, the anti-wetting film including a silane, a photoinitiator, and a solvent;
    evaporating the solvent from the anti-wetting film; and
    exposing the anti-wetting film to radiation, whereby the photoinitiator upon exposure to the radiation generates a catalyst that catalyzes:
        (i) condensation reactions between the silane and the hydroxyl groups of the etched-back surface to yield silane components coupled to the etched-back surface, and
        (ii) condensation reactions between the silane components coupled to the etched-back surface to form Si—O—Si bonds between the silane components,
    thereby forming an anti-wetting layer comprising silane components coupled to each other and to the etched-back surface of the imprint template.

2. The method of claim 1 wherein the silane is a fluorinated silane.

3. The method of claim 1 wherein the silane is selected from the group consisting of alkoxysilanes and chlorosilanes.

4. The method of claim 1 wherein the radiation is ultraviolet radiation.

5. The method of claim 1 wherein the generated catalyst is a superacid.

6. The method of claim 5 wherein the superacid is fluoroantimonic acid ($HSbF_6$).

7. The method of claim 1 wherein the silane is a monofunctional silane having a single silicon atom, a difunctional silane having two silicon atoms, or a combination thereof.

8. The method of claim 7 wherein the silane is a difunctional silane, and both silicon atoms of the difunctional silane are coupled to the etched back surface.

9. The method of claim 8 wherein the difunctional silane is fluorinated, and the fluorinated portion of the difunctional silane extends between the two silicon atoms coupled to the etched back surface.

10. The method of claim 7 wherein the silane comprises (tridecafluoro-1,1,2,2-tetrahydrooctyl) trichlorosilane (FOTS).

11. The method of claim 1 wherein the anti-wetting layer comprises a Si—O—Si network among the silane components coupled to the etched back surface.

12. The method of claim 1 wherein the photoinitiator is a cationic photoinitiator.

13. The method of claim 1 wherein the imprint template comprises silicon.

14. The method of claim 13 wherein the imprint template is formed from a material selected from the group consisting of fused-silica, quartz, silicon, siloxane polymers, and borosilicates.

15. The method of claim 13 wherein the hydroxyl groups of the etched-back surface of the imprint template are bonded to the silicon in the template.

16. The method of claim 1 wherein the solvent is a fluorinated solvent.

17. The method of claim 1 wherein the total content of the silane and the photoinitiator in the anti-wetting film is from about 0.001 wt % to about 5 wt %.

18. The method of claim 1 wherein the total content of the silane and the photoinitiator in the anti-wetting film is from about 0.01 wt % to about 1 wt %.

19. The method of claim 1 wherein the catalyst catalyzes hydrolysis of the silane.

20. The method of claim 19 wherein the catalyst reduces the dependence of the silane hydrolysis on environmental humidity.

* * * * *